(12) United States Patent
Guo et al.

(10) Patent No.: US 9,536,464 B2
(45) Date of Patent: Jan. 3, 2017

(54) DISPLAY PANEL AND DISPLAY METHOD THEREOF, AND DISPLAY DEVICE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Renwei Guo, Beijing (CN); Xue Dong, Beijing (CN); Peng Liu, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 18 days.

(21) Appl. No.: 14/415,644

(22) PCT Filed: Jun. 30, 2014

(86) PCT No.: PCT/CN2014/081122
§ 371 (c)(1),
(2) Date: Jan. 19, 2015

(87) PCT Pub. No.: WO2015/070620
PCT Pub. Date: May 21, 2015

(65) Prior Publication Data
US 2016/0027357 A1    Jan. 28, 2016

(30) Foreign Application Priority Data
Nov. 15, 2013 (CN) .......................... 2013 1 0573358

(51) Int. Cl.
*G09G 3/20* (2006.01)
*G09G 3/32* (2016.01)
(Continued)

(52) U.S. Cl.
CPC .............. *G09G 3/2003* (2013.01); *G09G 3/32* (2013.01); *G09G 3/36* (2013.01); *H01L 27/3213* (2013.01);
(Continued)

(58) Field of Classification Search
CPC ..................... G09G 3/2003; G09G 2300/0452; G09G 2320/0242; G09G 2340/0457; G09G 2320/0233; G02F 2201/52; G02F 1/133514; G02F 2001/134345; G02F 1/134336; H01L 27/3213; H01L 27/322; H01L 27/3216; H01L 27/3211
See application file for complete search history.

(56) References Cited

U.S. PATENT DOCUMENTS

2005/0225563 A1* 10/2005 Brown Elliott .......... G09G 5/02
345/604
2009/0073099 A1*  3/2009 Yeates ................... G02F 1/1362
345/88
(Continued)

FOREIGN PATENT DOCUMENTS

CN        1938751 A      3/2007
CN        101489143 A    7/2009
(Continued)

OTHER PUBLICATIONS

2nd office action issued in Chinese application No. 201310573358.9 dated Oct. 10, 2015.
(Continued)

*Primary Examiner* — Sanjiv D Patel
(74) *Attorney, Agent, or Firm* — Nath, Goldberg & Meyer; Joshua B. Goldberg

(57) ABSTRACT

The present invention provides a display panel and a display method thereof, and a display device. The display panel
(Continued)

comprises a plurality of sub-pixel arrays, each sub-pixel array is composed of eight sub-pixels arranged in two rows and four columns. In each sub-pixel array, four sub-pixels in a same row include three color sub-pixels and one compensation sub-pixel, the three color sub-pixels include one red sub-pixel, one green sub-pixel and one blue sub-pixel, colors of two sub-pixels in a same column are different from each other. The display method comprises: causing a plurality of color sub-pixels with the same color near a sub-pixel position to display, so that the required color component is displayed at the sub-pixel position under an average effect of the color sub-pixels with the same color; and performing display compensation on a sub-pixel position by using a plurality of compensation sub-pixels near the sub-pixel position.

8 Claims, 3 Drawing Sheets

(51) Int. Cl.
*H01L 27/32* (2006.01)
*G09G 3/36* (2006.01)

(52) U.S. Cl.
CPC ....... *H01L 27/3218* (2013.01); *G02F 2201/52* (2013.01); *G09G 2300/0452* (2013.01); *G09G 2320/0233* (2013.01); *G09G 2320/0242* (2013.01)

(56) References Cited

U.S. PATENT DOCUMENTS

| | | | | |
|---|---|---|---|---|
| 2009/0160871 A1* | 6/2009 | Hsu | ...................... | G09G 3/2003 345/589 |
| 2010/0073764 A1 | 3/2010 | Kai et al. | | |
| 2011/0227958 A1* | 9/2011 | Park | ...................... | G09G 3/20 345/690 |
| 2013/0050282 A1* | 2/2013 | Kim | ...................... | G09G 3/3413 345/690 |
| 2013/0077166 A1 | 3/2013 | Wang et al. | | |
| 2013/0208016 A1 | 8/2013 | Park et al. | | |
| 2014/0313112 A1* | 10/2014 | Madhusudan | ....... | G09G 3/3208 345/83 |

FOREIGN PATENT DOCUMENTS

| | | |
|---|---|---|
| CN | 101827273 A | 9/2010 |
| CN | 102779495 A | 11/2012 |
| CN | 103559849 A | 2/2014 |
| CN | 203705760 U | 7/2014 |
| JP | 2006-19736 A | 1/2006 |
| JP | 2009-69833 A | 4/2009 |
| KR | 10-2006-0036373 A | 4/2006 |

OTHER PUBLICATIONS

Form PCT/ISA/237 issued in International Application No. PCT/CN2014/081122 dated Oct. 9, 2014.

Office Action Issued in Chinese Application No. 201310573358.9 issued Apr. 20, 2015.

International Search Report dated Jun. 30, 2014 from PCT/CN2014/081122.

European Search Report dated Jun. 1, 2016 issued in corresponding European Application No. EP 14853129.6.

* cited by examiner

DISPLAY PANEL AND DISPLAY METHOD THEREOF, AND DISPLAY DEVICE

This is a National Phase Application filed under 35 U.S.C. 371 as a national stage of PCT/CN2014/081122, filed Jun. 30, 2014, an application claiming the benefit of Chinese Application No. 201310573358.9, filed Nov. 15, 2013, the content of each of which is hereby incorporated by reference in its entirety.

FIELD OF THE INVENTION

The present invention relates to the field of display technology, and in particular, relates to a display panel and a display method thereof and a display device.

BACKGROUND OF THE INVENTION

In a conventional liquid crystal display device or organic light emitting diode (OLED) display device, each point (pixel) displays colors by a plurality of sub-pixels through light mixing, e.g. each pixel is composed of a red sub-pixel, a green sub-pixel and a blue sub-pixel (i.e., in RGB mode).

To improve the visual effect, the requirement for resolution (the number of pixels in a unit size) of a display device is increasingly high, this requires increasingly small size of the sub-pixels, but the size of the sub-pixels cannot be infinitely reduced due to process limitation.

To improve the display effect under the condition that the size of the sub-pixels is definite, a display device of a Pentile mode is proposed. In the display device of the Pentile mode, the number of sub-pixels of part of colors (e.g. red sub-pixels and blue sub-pixels) is halved, meanwhile, in the display device, the sub-pixels of different colors are virtualized as in different "layers", each layer is divided into a plurality of sampling areas, the divided sampling areas of each layer are not superposed, and then the content to be displayed by each sub-pixel is calculated by using an area ratio of the sampling areas. A part of the sub-pixels in the display device of the Pentile mode are "shared", so that a resolution higher than the practical resolution is achieved on the visual effect.

However, the display effect of the existing display device of the Pentile mode is still not ideal. Since the number of the sub-pixels of part of colors is halved, the sub-pixels of various colors are not uniformly distributed, and the problems of serrated grains, latticed spots, unclear display of small contents and the like are easily caused. Meanwhile, due to a calculation mode of "layer and area division", a complex calculation process is needed for calculating the content which needs to be displayed by each sub-pixel, and the calculation quantity is large.

SUMMARY OF THE INVENTION

For solving the technical problems of poor display effect and large calculation quantity in the existing high-resolution display technology, the present invention provides a display panel and a display method thereof and a display device with high resolution, good display effect and small required calculation quantity.

According to an aspect of the present invention, a display panel is provided, comprising a plurality of sub-pixel arrays, and each sub-pixel array is composed of eight sub-pixels arranged in two rows and four columns. In each sub-pixel array, four sub-pixels in a same row include three color sub-pixels and one compensation sub-pixel, the three color sub-pixels include one red sub-pixel, one green sub-pixel and one blue sub-pixel, and colors of two sub-pixels in a same column are different from each other.

In the display panel, the above-mentioned "row" and "column" are for a matrix composed of a plurality of sub-pixels, wherein the sub-pixels are arranged in a plurality of parallel straight lines (or rows) along the "row" direction, and the sub-pixels are arranged in a plurality of parallel straight lines along the "column" direction, the "row" is perpendicular to the "column". Accordingly, the "row" and the "column" only indicate two opposite directions, and are irrelevant with the shape (rectangular, circular or special-shaped) of the sub-pixels, the placement manner (placed vertically, placed horizontally, upright, inverted or the like) of the display panel and the arrangement mode of gate lines and data lines. For example, each line of sub-pixels parallel to a gate line may be considered as a "row", or each line of sub-pixels parallel to a data line may be considered as a "row". For example, when a display panel is placed normally, each line of sub-pixels parallel to the ground may be considered as a "row", or each line of sub-pixels perpendicular to the ground may be considered as a "row".

In the display panel, four sub-pixels arranged in two rows and two columns at any position may include one red sub-pixel, one green sub-pixel, one blue sub-pixel and one compensation sub-pixel.

The sub-pixels in the sub-pixel array may have an arrangement mode of any one of the following eleven modes: 1) a first row from left to right orderly include B, G, X and R, and a second row from left to right orderly include X, R, B and G; 2) a first row from left to right orderly include B, G, R and X, and a second row from left to right orderly include X, R, B and G; 3) a first row from left to right orderly include B, R, X and G, and a second row from left to right orderly include X, G, R and B; 4) a first row from left to right orderly include B, R, X and G, and a second row from left to right orderly include X, G, B and R; 5) a first row from left to right orderly include B, R, X and G, and a second row from left to right orderly include G, X, B and R; 6) a first row from left to right orderly include G, B, X and R, and a second row from left to right orderly include X, R, G and B; 7) a first row from left to right orderly include G, R, X and B, and a second row from left to right orderly include X, B, G and R; 8) a first row from left to right orderly include G, B, R and X, and a second row from left to right orderly include X, R, G and B; 9) a first row from left to right orderly include G, R, B and X, and a second row from left to right orderly include X, B, G and R; 10) a first row from left to right orderly include G, R, X and B, and a second row from left to right orderly include X, B, G and R; and 11) a first row from left to right orderly include X, B, G and R, and a second row from left to right orderly include G, R, X and B, wherein R indicates a red sub-pixel, G indicates a green sub-pixel, B indicates a blue sub-pixel, and X indicates a compensation sub-pixel.

The compensation sub-pixel may be any one of white sub-pixel, yellow sub-pixel and cyan sub-pixel.

The display panel may be an organic light emitting diode display panel, the sub-pixel comprises a light emitting unit, and colors of light emitted by the light emitting units correspond to colors of the three color sub-pixels and the one compensation sub-pixel.

The display panel may be a liquid crystal display panel, the sub-pixel comprises a filter unit, and colors of light penetrating through the filter units correspond to colors of the three color sub-pixels and the one compensation sub-pixel.

The plurality of sub-pixel arrays in the display panel are repeatedly arranged row by row, and the plurality of sub-pixel arrays in the display panel are repeatedly arranged column by column, so that the plurality of sub-pixel arrays as repetitive units cover the whole display panel.

According to another aspect of the present invention, a display device is provided, comprising the above-mentioned display panel.

In the display panel and the display device of the present invention, the sub-pixels of each color are equal in number and are uniformly distributed, so that serrated grains, latticed spots and the like are not produced. Meanwhile, the sub-pixels of each color are arranged in a specific manner, so that a higher resolution may be realized on the visual effect, and the calculation quantity required in the display process is small. In addition, the compensation sub-pixel is comprised, so that better display effect may be achieved.

According to a further aspect of the present invention, a display method of the above-mentioned display panel is provided, comprising the following steps of: displaying a required color component of red, green or blue at each sub-pixel position, wherein this step comprises causing a plurality of color sub-pixels with the same color near a sub-pixel position to display, so that the required color component is displayed at the sub-pixel position under an average effect of the color sub-pixels with the same color; and performing display compensation on each sub-pixel position, wherein this step comprises performing display compensation on a sub-pixel position by using a plurality of compensation sub-pixels near the sub-pixel position.

In the display method, when a color component identical to the sub-pixel color of a sub-pixel position needs to be displayed at the sub-pixel position, the plurality of color sub-pixels with the same color near the sub-pixel position comprise a color sub-pixel at the sub-pixel position and a plurality of color sub-pixels with the color around the sub-pixel position. When a color component different from the sub-pixel color of a sub-pixel position needs to be displayed at the sub-pixel position, the plurality of color sub-pixels with the same color near the sub-pixel position comprise a plurality of color sub-pixels with a required color around the sub-pixel position.

When a color component identical to the sub-pixel color of a sub-pixel position needs to be displayed at the sub-pixel position, the plurality of color sub-pixels with the color around the sub-pixel position comprise: four color sub-pixels with the color respectively in two rows adjacent to the row of the sub-pixel position, and respectively on two sides of the sub-pixel position in the row direction and closest to the sub-pixel position.

When a color component different from the sub-pixel color of a sub-pixel position needs to be displayed at the sub-pixel position, the plurality of color sub-pixels with a required color around the sub-pixel position comprise any one of the followings: two color sub-pixels with the required color in two rows adjacent to the row of the sub-pixel position and in the same column as the sub-pixel position; or one color sub-pixel with the required color in the same row as the sub-pixel position and adjacent to the sub-pixel position, and two color sub-pixels with the required color in two rows adjacent to the row of the sub-pixel position and closest to the sub-pixel position in the row direction.

In the display method, when display compensation is performed on a compensation sub-pixel position, the plurality of compensation sub-pixels near the sub-pixel position comprise a compensation sub-pixel at the compensation sub-pixel position and a plurality of compensation sub-pixels around the compensation sub-pixel position. When display compensation is performed on a color sub-pixel position, the plurality of compensation sub-pixels near the sub-pixel position comprise a plurality of compensation sub-pixels around the color sub-pixel position.

When display compensation is performed on a compensation sub-pixel position, the plurality of compensation sub-pixels around the sub-pixel position comprise: four compensation sub-pixels respectively in two rows adjacent to the row of the compensation sub-pixel position, and respectively on two sides of the compensation sub-pixel position in the row direction and closest to the compensation sub-pixel position.

When display compensation is performed on a color sub-pixel position, the plurality of compensation sub-pixels around the sub-pixel position comprise any one of the followings: two compensation sub-pixels in two rows adjacent to the row of the color sub-pixel position and in the same column as the color sub-pixel position; or one compensation sub-pixel in the same row as the color sub-pixel position and adjacent to the color sub-pixel position, and two compensation sub-pixels in two rows adjacent to the row of the color sub-pixel position and closest to the color sub-pixel position in the row direction.

In the display method of the present invention, any color component may be displayed at each sub-pixel position (e.g. a blue component may be displayed at a red sub-pixel position by blue sub-pixels near the red sub-pixel position) and may be compensated, namely, a complete content may be displayed at each sub-pixel position, which is equivalent to a pixel, so the resolution on the visual effect is greatly improved. Meanwhile, the content displayed at each sub-pixel position is an average result of a plurality of sub-pixels near the sub-pixel position, so the displayed color is uniform and soft and the display effect is good. In addition, each sub-pixel position is used as a unit for displaying, and the contents which need to be displayed by the sub-pixels near the sub-pixel position are correspondingly calculated, so that complex calculation of "layer and area division" is not needed, the calculation quantity is small, and the method is easy to be implemented.

BRIEF DESCRIPTION OF THE DRAWINGS

FIG. 1 is a schematic diagram of a sub-pixel arrangement mode of a display panel according to an embodiment of the present invention.

FIG. 2 is a schematic diagram of sub-pixel arrangement modes in eleven sub-pixel arrays of a display panel according to an embodiment of the present invention.

FIG. 3 is a schematic diagram for illustrating a sub-pixel arrangement mode of a display panel according to an embodiment of the present invention.

FIG. 4 is a schematic diagram for illustrating a display method of a display panel according to an embodiment of the present invention.

FIG. 5 is a schematic diagram for illustrating a display method of a display panel according to an embodiment of the present invention.

FIG. 6 is a schematic diagram for illustrating a display method of a display panel according to an embodiment of the present invention.

FIG. 7 is a schematic diagram for illustrating a display method of a display panel according to an embodiment of the present invention.

FIG. 8 is a schematic diagram for illustrating a display method of a display panel according to an embodiment of the present invention.

FIG. 9 is a schematic diagram for illustrating a display method of a display panel according to an embodiment of the present invention.

FIG. 10 is a schematic diagram for illustrating a display method of a display panel according to an embodiment of the present invention.

DESCRIPTION OF THE PREFERRED EMBODIMENT

To make those skilled in the art better understand the technical solutions of the present invention, the present invention will be further described in detail below in combination with the accompanying drawings and specific implementations.

Figures 1, 2, 3:
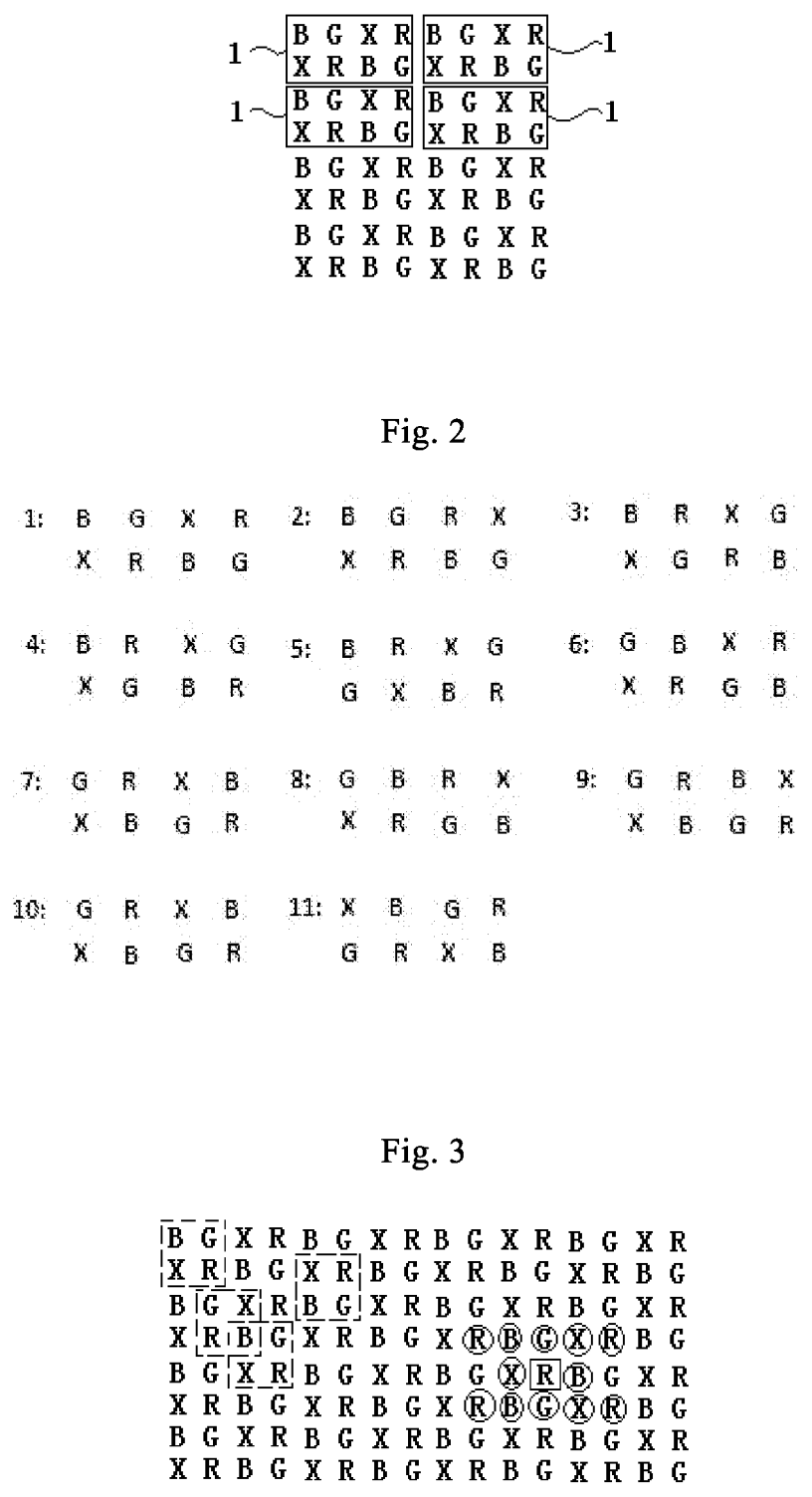

As shown in FIG. 1, a display panel according to an embodiment of the present invention comprises a plurality of sub-pixel arrays 1, and each sub-pixel array 1 is composed of eight sub-pixels arranged in two rows and four columns. In each sub-pixel array 1, four sub-pixels in a same row include three color sub-pixels and one compensation sub-pixel X, the three color sub-pixels include one red sub-pixel, one green sub-pixel and one blue sub-pixel, and colors of two sub-pixels in a same column are different from each other. That is to say, eight sub-pixels in each sub-pixel array 1 include two red sub-pixels R, two green sub-pixels G, two blue sub-pixels B and two compensation sub-pixels X, colors of four sub-pixels in each row are different from each other, and colors of two sub-pixels in each column are different from each other. As such, the sub-pixels with the same color are not adjacent to each other (adjacent to each other refers to leaning against each other without intervals therebetween) in the row direction and the column direction throughout the display panel.

That is to say, the display panel of the embodiment comprises four kinds of sub-pixels, namely red, green and blue color sub-pixels for displaying required color components and one kind of compensation sub-pixel X for display compensation. Different from a conventional display panel, eight sub-pixels constitute one sub-pixel array 1 instead of four sub-pixels constituting one pixel unit in the display panel of the embodiment, and a plurality of sub-pixel arrays 1 are arranged into a matrix and finally form an array of sub-pixels. That is to say, each sub-pixel array 1 (comprising eight sub-pixels) may be regarded as a "point", and the "points" are arranged into a matrix.

For example, a plurality of sub-pixel arrays 1 as repetitive units are arranged throughout the display panel, i.e., the plurality of sub-pixel arrays 1 are repeatedly arranged row by row and column by column.

In the display panel of the embodiment, the sub-pixels of each color are equal in number and are uniformly distributed, so that serrated grains, latticed spots and the like are not produced. Meanwhile, the sub-pixels of each color are arranged in a specific manner, so that a higher resolution may be realized on the visual effect, and the calculation quantity in the display process is small. In addition, the compensation sub-pixel X is comprised, so that better display effect is achieved.

For example, a sub-pixel arrangement mode in the sub-pixel array 1 may be any one of eleven arrangement modes shown in FIG. 2. Researches discover that, better display effect can be achieved by the eleven arrangement modes.

For example, the compensation sub-pixel X is any one of a white sub-pixel, a yellow sub-pixel and a cyan sub-pixel. All of the above sub-pixels may play a role of display compensation, wherein the white sub-pixel may be used for adjusting brightness of display panel, the yellow sub-pixel may be used for improving color gamut of display panel, and the cyan sub-pixel may be used for compensating blue color, increasing color gamut and improving display effect. Of course, the compensation sub-pixel X may be in any other color in the visible range, as long as play a role of adjusting display effect.

For example, in the display panel, four sub-pixels arranged in two rows and two columns at any position include one red sub-pixel R, one green sub-pixel G, one blue sub-pixel B and one compensation sub-pixel X.

Figures 4, 5, 6:
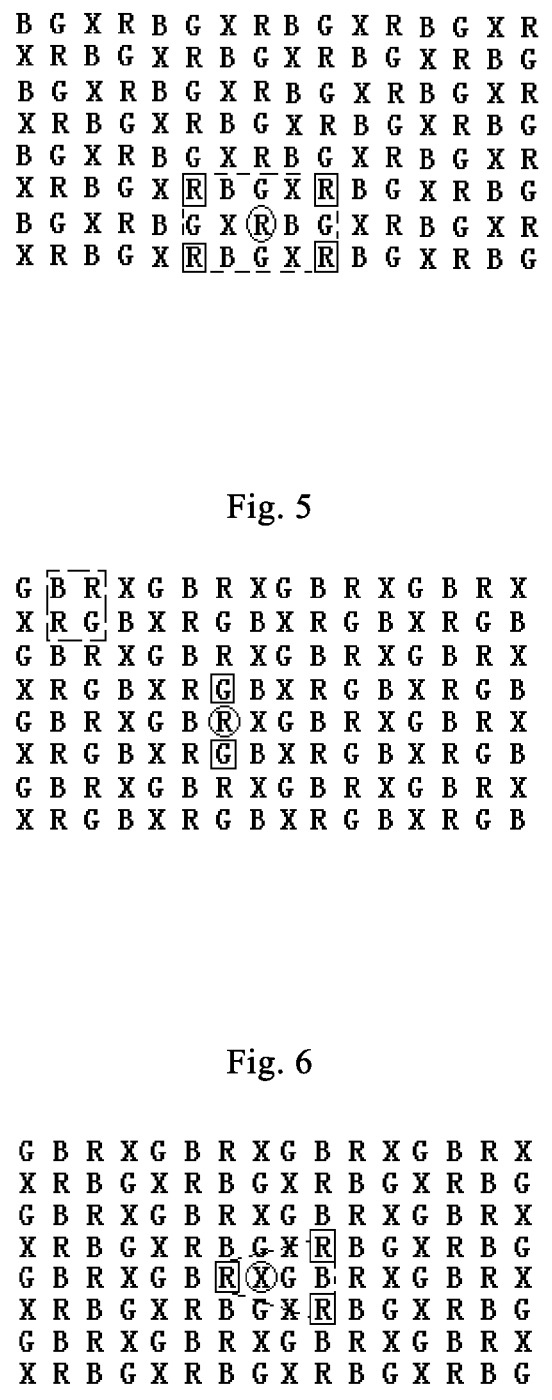

That is to say, as shown in FIG. 3, kinds of four sub-pixels arranged in square (sub-pixels in dotted boxes in the figure) at any position are different from each other. In the display panel satisfying this rule, the same kind of sub-pixels are not adjacent to each other in oblique direction, so that better display effect can be achieved. Alternatively, as shown in FIG. 5, if there are sub-pixels of the same kind (e.g., two red sub-pixels R in the dotted box in the figure) in part of four sub-pixels arranged in square, the present invention may also be achieved.

Each sub-pixel in the display panel may independently emit light with required color and brightness. Generally, the sub-pixels are controlled by a thin-film transistor array (active drive array), each sub-pixel corresponds to at least one thin-film transistor (for an organic light emitting diode display device, each sub-pixel corresponds to a plurality of thin-film transistors), and the thin-film transistors are arranged to form an array and controlled by gate lines and data lines.

In some embodiments, the display panel may be an organic light emitting diode display panel, each sub-pixel comprises a light emitting unit, and the colors of light emitted by the light emitting units of the sub-pixels correspond to the colors of the three color sub-pixels and the compensation sub-pixel X.

That is to say, the display panel of this embodiment may be an organic light emitting diode display panel, wherein an organic light emitting diode (light emitting unit) is provided at each sub-pixel, the organic light emitting diodes may emit light with different colors (which may be realized by using different organic light emitting layers), and the color of light emitted by each organic light emitting diode is the same as that of the sub-pixel where the organic light emitting diode is located, e.g. the organic light emitting diode at the red sub-pixel R emits red light.

In other embodiments, the display panel may also be a liquid crystal display panel, the sub-pixel of the display panel comprises a filter unit, and the colors of light penetrating through the filter units of the sub-pixels correspond to the colors of three color sub-pixels and the compensation sub-pixel X.

That is to say, the display panel of this embodiment may also be a liquid crystal display panel, the liquid crystal display panel itself does not emit light, and light coming from a back light source is filtered to realize display, wherein a color filter membrane (filter unit) with different color is arranged at each sub-pixel, light penetrating through the color filter membrane may be converted to the corresponding color, and the color of the color filter membrane at each sub-pixel is the same as the color of the sub-pixel, e.g. the color filter membrane at the red sub-pixel R is red, etc.

Certainly, other types of display panels are also feasible, as long as lights with corresponding colors are emitted at the sub-pixels, and the different types of display panels may adopt known structures and therefore are no longer described in detail herein.

An embodiment of the present invention further provides a display device, comprising the above-mentioned display panel.

Moreover, an embodiment of the present invention further provides a display method of the above-mentioned display panel, comprising the following steps: displaying a required color component of red, green or blue at each sub-pixel position, this step including causing a plurality of color sub-pixels with the same color near a sub-pixel position to display, so that the required color component is displayed at the sub-pixel position under the average effect of the color sub-pixels with the same color; and performing display compensation on the sub-pixel positions, this step including performing display compensation on the sub-pixel position by using a plurality of compensation sub-pixels X near the sub-pixel position.

The above two steps indicate two operations respectively used for displaying the components of three kinds of colors and performing display compensation in the display process, so the two steps unnecessarily involve a precedence relationship in time sequence.

It is thus clear that, in the display method of the embodiment, any required color component (i.e., red, green or blue color component) may be displayed at each sub-pixel position (rather than each sub-pixel), and each color component of each sub-pixel position is displayed by a plurality of color sub-pixels with corresponding color near the sub-pixel position together, so that the required color component is displayed at each sub-pixel position under the average effect of the color sub-pixels. Meanwhile, display compensation is performed on the sub-pixel position by using the compensation sub-pixel X in the embodiment, so as to improve the display effect. Each sub-pixel position is compensated by a plurality of compensation sub-pixels X near the sub-pixel position.

In the display method of the embodiment, 1), any color component may be displayed at each sub-pixel position (e.g. a blue component may be displayed at a red sub-pixel R position by blue sub-pixels B near the red sub-pixel R position), namely, a complete content may be displayed at each sub-pixel position, and each sub-pixel position is equivalent to one "pixel", so that the resolution on the visual effect is greatly improved; 2), display compensation may be performed on each sub-pixel position, so that a good display effect is achieved by the compensation sub-pixel X; 3), the content displayed (compensated) at each sub-pixel position is an average result of a plurality of sub-pixels near the sub-pixel position, so the displayed color is uniform and soft and the display effect is good; and 4), display is performed based on each sub-pixel position in the display method of this embodiment, and the contents to be displayed by the sub-pixels near the sub-pixel position are correspondingly calculated, so that the content to be displayed by each sub-pixel may be directly calculated, complex calculation of "layer and area division" is not needed, the calculation quantity is small, and the method is easy to be implemented.

In the display method of the embodiment, for example, when a color component identical to the sub-pixel color of a sub-pixel position needs to be displayed at the sub-pixel position (e.g. a red component needs to be displayed at the red sub-pixel R position), the plurality of color sub-pixels with the same color near the sub-pixel position include a color sub-pixel (the red sub-pixel R) at the sub-pixel position and a plurality of color sub-pixels (red sub-pixels R) with the color around the sub-pixel position.

In addition, when a color component different from the sub-pixel color of a sub-pixel position needs to be displayed at the sub-pixel position (e.g. a green component needs to be displayed at the red sub-pixel R position), the plurality of color sub-pixels with the same color near the sub-pixel position include a plurality of color sub-pixels with a required color (green sub-pixels G) around the sub-pixel position. That is to say, the "the color sub-pixels with the same color near the sub-pixel position" do not include the sub-pixel at the sub-pixel position (due to different color). Since the color of the compensation sub-pixel X is different from red, green and blue color components, the position where the compensation sub-pixel X is located belongs to above case of "different color".

According to different requirements, the selection method of "the color sub-pixels near the sub-pixel position" is diverse.

For example, as shown in FIG. 4, when a color component identical to the sub-pixel color of a sub-pixel position needs to be displayed at the sub-pixel position, the plurality of color sub-pixels with the color around the sub-pixel position include four color sub-pixels with the color respectively in two rows adjacent to the row of the sub-pixel position, respectively on two sides of the sub-pixel position in the row direction and closest to the sub-pixel position.

That is to say, as shown in FIG. 4, when a color component identical to the sub-pixel color of a sub-pixel (the circled red sub-pixel R in the figure) position needs to be displayed at the sub-pixel position, the color component is displayed by a plurality of color sub-pixels with the color around the sub-pixel position besides the sub-pixel at the sub-pixel position, the "color sub-pixels around the sub-pixel position" include four color sub-pixels with the color (four boxed red sub-pixels R in the figure) in two rows adjacent to the row of the sub-pixel position (two color sub-pixels in each row), respectively on right and left sides of the sub-pixel position (two color sub-pixels on each side) and closest to the sub-pixel position in the row direction (distances at left and right sides may be different). As such, the four color sub-pixels satisfying the above condition definitely constitute a "rectangle", and the sub-pixel position is located in the rectangle.

For example, when a color component different from the sub-pixel color of a sub-pixel position needs to be displayed at the sub-pixel position, the plurality of color sub-pixels with a required color around the sub-pixel position includes any one of following two different cases.

In the first case, as shown in FIG. 5, the plurality of color sub-pixels with a required color around the sub-pixel position includes two color sub-pixels with the required color in two rows adjacent to the row of the sub-pixel position and in the same column as the sub-pixel position.

That is to say, as shown in FIG. 5, when a color component different from the sub-pixel color of a sub-pixel position needs to be displayed at the sub-pixel position (e.g., a green component is required to be displayed at the circled red sub-pixel R position in the figure), "color sub-pixels around the sub-pixel position" may include two color sub-pixels with the required color provided above and below the sub-pixel position and adjacent to the sub-pixel position (boxed green sub-pixels G in the figure).

In the second case, as shown in FIG. 6, the plurality of color sub-pixels with a required color around the sub-pixel position includes: one color sub-pixel with the required color in the same row as the sub-pixel position and adjacent to the sub-pixel position; and two color sub-pixels with the required color in two rows adjacent to the row of the sub-pixel position and closest to the sub-pixel position in the row direction.

That is to say, as shown in FIG. 6, when a color component different from the sub-pixel color of a sub-pixel position needs to be displayed at the sub-pixel position (e.g., a red component is required to be displayed at the circled compensation sub-pixel X position in the figure), "color sub-pixels around the sub-pixel position" may include: one color sub-pixel in the same row as the sub-pixel position and adjacent to the sub-pixel position (boxed red sub-pixel R at left side of the circled compensation sub-pixel X in the figure); and two color sub-pixels respectively in two rows provided above and below the row of the sub-pixel position and adjacent to the row of the sub-pixel position, and closest to the sub-pixel position in the row direction (two boxed red sub-pixels R at right side of the circled compensation sub-pixel X in the figure). As such, when the above condition is satisfied, the three "color sub-pixels around the sub-pixel position" definitely constitute an "isosceles triangle", the bottom edge of the isosceles triangle is parallel to the column direction, and the sub-pixel position is located in the triangle.

The above selection method of the "color sub-pixels around the sub-pixel position" may ensure that the selected color sub-pixels are close to the sub-pixel position and are not much in number, so that a good display effect may be achieved and over large calculation quantity during display may be avoided.

It should be understood that, "color sub-pixels around the sub-pixel position" of the above two cases have similar characteristics in the arrangement mode of the sub-pixel array 1 of FIG. 4. Further, in the display panels in which sub-pixel arrays shown in FIG. 2 are repeatedly arranged, the above "color sub-pixels around the sub-pixel position" have similar characteristics, and are no longer described herein.

In the display method of the embodiment, for example, when display compensation is performed on the compensation sub-pixel X position, a plurality of compensation sub-pixels X near the sub-pixel position include a compensation sub-pixel X at the sub-pixel position and a plurality of compensation sub-pixels X around the sub-pixel position.

In addition, when display compensation is performed on the color sub-pixel position, the plurality of compensation sub-pixels X near the sub-pixel position include a plurality of compensation sub-pixels X around the sub-pixel position.

That is to say, similar to display of red, green and blue components, when the compensation is performed, the selection method of the plurality of compensation sub-pixels X near the sub-pixel position is diverse according to a type of the sub-pixel at the sub-pixel position to be compensated, the plurality of compensation sub-pixels X near the sub-pixel position may include the sub-pixel at the sub-pixel position (when the sub-pixel is the compensation pixel X), or may not include the sub-pixel at the sub-pixel position (when the sub-pixel is the color sub-pixel).

Likewise, similar to display of red, green and blue components, the selection method of "compensation sub-pixels X around the sub-pixel position" is diverse.

Figures 7, 8, 9, 10:
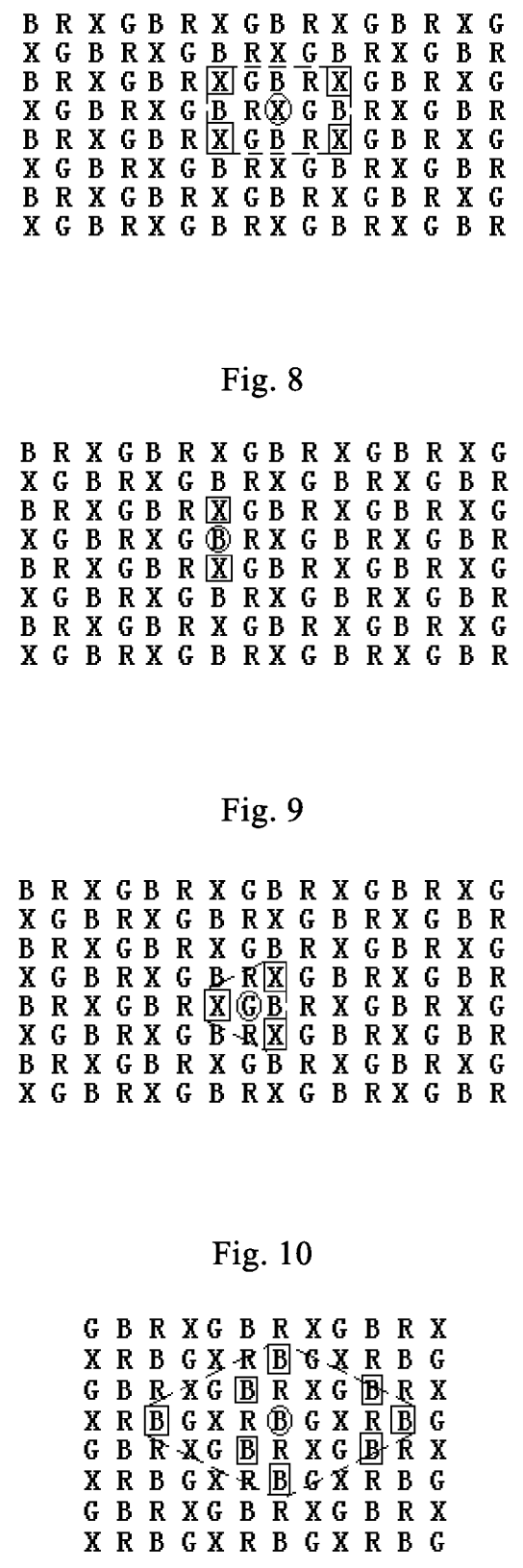

As shown in FIG. 7, when display compensation is performed on the compensation sub-pixel X (circled compensation sub-pixel X in the figure) position, the plurality of compensation sub-pixels X around the sub-pixel position include four compensation sub-pixels X respectively in two rows adjacent to the row of the sub-pixel position, respectively on two sides of the sub-pixel position in the row direction and closest to the sub-pixel position (four boxed compensation sub-pixels X in the figure), i.e., "compensation sub-pixels X around the sub-pixel position" may also constitute a "rectangle".

When display compensation is performed on the color sub-pixel (circled blue sub-pixel B in the figure) position, as shown in FIG. 8, the plurality of compensation sub-pixels X around the sub-pixel position include two compensation sub-pixels X in two rows adjacent to the row of the sub-pixel position and in the same column as the sub-pixel position (boxed compensation sub-pixels X in the figure), i.e., "compensation sub-pixels X around the sub-pixel position" may be two compensation sub-pixels X provided above and below the sub-pixel position and adjacent to the sub-pixel position.

Alternatively, as shown in FIG. 9, when display compensation is performed on the color sub-pixel (circled green sub-pixel G in the figure) position, the plurality of compensation sub-pixels X around the sub-pixel position include: one compensation sub-pixel X in the same row as the sub-pixel position and adjacent to the sub-pixel position; and two compensation sub-pixels X in two rows adjacent to the row of the sub-pixel position and closest to the sub-pixel position in the row direction (boxed compensation sub-pixels X in the figure), i.e., "compensation sub-pixels X around the sub-pixel position" may also constitute a "isosceles triangle".

By the above selection method of "compensation sub-pixels X around the sub-pixel position", better display effect may be achieved and calculation quantity will not increase significantly.

It should be understood that, in the embodiments of the present invention, the content of each sub-pixel position is displayed (compensated) by a plurality of sub-pixels together, and accordingly, each sub-pixel is not only used for display at a position, but also used for displays at multiple sub-pixel positions. For example, as shown in FIG. 3, for the boxed red sub-pixel R in the figure, when the plurality of sub-pixel (circled sub-pixels in the figure) positions around the red sub-pixel R are required to display the red component, the red sub-pixel R may participate in display. Therefore, the content to be displayed by any one of sub-pixels is determined according to the contents to be displayed by the plurality of sub-pixel positions corresponding to the sub-pixel together.

It should be understood that, the selection method of the "color (compensation) sub-pixels around sub-pixel position" above is not used for limiting the embodiments of the present invention. For example, as shown in FIG. 10, when a blue component is displayed at the circled blue sub-pixel B position in the figure, the "color sub-pixels around the sub-pixel position" also may include eight boxed blue sub-pixels B. Four of these blue sub-pixels B constitute a "quadrilateral", and all blue sub-pixels B in the quadrilateral are the "color sub-pixels around sub-pixel position". In a word, color (compensation) sub-pixels relatively close to a certain sub-pixel position may be the "color (compensation) sub-pixels around the sub-pixel position".

It should be understood that, the selection method of the "color (compensation) sub-pixels around the sub-pixel position" above may be changed at any time according to the specific displayed contents. For example, in different frames of pictures, "the color sub-pixels around the sub-pixel position" used when the same color is displayed at the same sub-pixel position may be different (e.g. two color sub-pixels are used in the first frame of picture, and three sub-pixels are used in the second frame of picture). Further, in a frame of picture, the selection methods of the "color (compensation) sub-pixels around the sub-pixel position" for different sub-pixel positions also may be different.

It should be understood that, when the "color (compensation) sub-pixels around the sub-pixel position" are determined, the selection methods of the "color (compensation) sub-pixels around the sub-pixel position" for the sub-pixel positions close to the edges of the display panel may be different from above. For example, there is no other sub-pixels above the top row of sub-pixel positions of the display panel, so only the sub-pixels below the top row of sub-pixel positions may be used as the "color (compensation) sub-pixels around the sub-pixel position".

It could be understood that, the above implementation ways are merely exemplary embodiments adopted for describing the principle of the present invention, but the present invention is not limited thereto. Various modifications and improvements may be made by those of ordinary skill in the art without departing from the spirit and essence of the present invention, and these modifications and improvements are contemplated as within the protection scope of the present invention.

The invention claimed is:

1. A display method of a display panel, the display panel comprising a plurality of sub-pixel arrays, each sub-pixel array being composed of eight sub-pixels arranged in two rows and four columns, wherein in each sub-pixel array, four sub-pixels in a same row include three color sub-pixels and one compensation sub-pixel, the three color sub-pixels include one red sub-pixel, one green sub-pixel and one blue sub-pixel, and colors of two sub-pixels in a same column are different from each other, the display method comprising steps of:
displaying a required color component of red, green or blue at each sub-pixel position, wherein this step comprises causing a plurality of color sub-pixels with the same color near a sub-pixel position to display, so that the required color component is displayed at the sub-pixel position under an average effect of the color sub-pixels with the same color; and
performing display compensation on each sub-pixel position, wherein this step comprises performing display compensation on a sub-pixel position by using a plurality of compensation sub-pixels near the sub-pixel position,
wherein when a color component identical to the sub-pixel color of a sub-pixel position needs to be displayed at the sub-pixel position, the plurality of color sub-pixels with the same color near the sub-pixel position comprise a color sub-pixel at the sub-pixel position and a plurality of color sub-pixels with the color around the sub-pixel position, and
when a color component different from the sub-pixel color of a sub-pixel position needs to be displayed at the sub-pixel position, the plurality of color sub-pixels with the same color near the sub-pixel position comprise a plurality of color sub-pixels with a required color around the sub-pixel position.

2. The display method of claim 1, wherein when a color component identical to the sub-pixel color of a sub-pixel position needs to be displayed at the sub-pixel position, the plurality of color sub-pixels with the color around the sub-pixel position comprise:
four color sub-pixels with the color respectively in two rows adjacent to the row of the sub-pixel position, and respectively on two sides of the sub-pixel position in the row direction and closest to the sub-pixel position.

3. The display method of claim 1, wherein when a color component different from the sub-pixel color of a sub-pixel position needs to be displayed at the sub-pixel position, the plurality of color sub-pixels with a required color around the sub-pixel position comprise any one of the followings:
two color sub-pixels with the required color in two rows adjacent to the row of the sub-pixel position and in the same column as the sub-pixel position; or
one color sub-pixel with the required color in the same row as the sub-pixel position and adjacent to the sub-pixel position, and two color sub-pixels with the required color in two rows adjacent to the row of the sub-pixel position and closest to the sub-pixel position in the row direction.

4. The display method of claim 1, wherein
when display compensation is performed on a compensation sub-pixel position, the plurality of compensation sub-pixels near the sub-pixel position comprise a compensation sub-pixel at the compensation sub-pixel position and a plurality of compensation sub-pixels around the compensation sub-pixel position; and
when display compensation is performed on a color sub-pixel position, the plurality of compensation sub-pixels near the sub-pixel position comprise a plurality of compensation sub-pixels around the color sub-pixel position.

5. The display method of claim 4, wherein when display compensation is performed on a compensation sub-pixel position, the plurality of compensation sub-pixels around the sub-pixel position comprise:
four compensation sub-pixels respectively in two rows adjacent to the row of the compensation sub-pixel position, and respectively on two sides of the compensation sub-pixel position in the row direction and closest to the compensation sub-pixel position.

6. The display method of claim 4, wherein when display compensation is performed on a color sub-pixel position, the plurality of compensation sub-pixels around the sub-pixel position comprise any one of the followings:
two compensation sub-pixels in two rows adjacent to the row of the color sub-pixel position and in the same column as the color sub-pixel position; or
one compensation sub-pixel in the same row as the color sub-pixel position and adjacent to the color sub-pixel position, and two compensation sub-pixels in two rows adjacent to the row of the color sub-pixel position and closest to the color sub-pixel position in the row direction.

7. The display method of claim 1, wherein the sub-pixels in the sub-pixel array has an arrangement mode of any one of the following eleven modes:
1) a first row from left to right orderly include B, G, X and R, and a second row from left to right orderly include X, R, B and G;
2) a first row from left to right orderly include B, G, R and X, and a second row from left to right orderly include X, R, B and G;
3) a first row from left to right orderly include B, R, X and G, and a second row from left to right orderly include X, G, R and B;
4) a first row from left to right orderly include B, R, X and G, and a second row from left to right orderly include X, G, B and R;

5) a first row from left to right orderly include B, R, X and G, and a second row from left to right orderly include G, X, B and R;
6) a first row from left to right orderly include G, B, X and R, and a second row from left to right orderly include X, R, G and B;
7) a first row from left to right orderly include G, R, X and B, and a second row from left to right orderly include X, B, G and R;
8) a first row from left to right orderly include G, B, R and X, and a second row from left to right orderly include X, R, G and B;
9) a first row from left to right orderly include G, R, B and X, and a second row from left to right orderly include X, B, G and R;
10) a first row from left to right orderly include G, R, X and B, and a second row from left to right orderly include X, B, G and R; and
11) a first row from left to right orderly include X, B, G and R, and a second row from left to right orderly include G, R, X and B, wherein R indicates a red sub-pixel, G indicates a green sub-pixel, B indicates a blue sub-pixel, and X indicates a compensation sub-pixel.

8. The display method of claim 1, wherein the compensation sub-pixel is any one of white sub-pixel, yellow sub-pixel and cyan sub-pixel.

* * * * *